US 8,350,833 B2

(12) United States Patent
Taniguchi

(10) Patent No.: US 8,350,833 B2
(45) Date of Patent: Jan. 8, 2013

(54) PLASMA DISPLAY DEVICE

(75) Inventor: Tsukasa Taniguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 158 days.

(21) Appl. No.: 12/374,428

(22) PCT Filed: Apr. 4, 2008

(86) PCT No.: PCT/JP2008/000870
§ 371 (c)(1),
(2), (4) Date: Jan. 20, 2009

(87) PCT Pub. No.: WO2008/129857
PCT Pub. Date: Oct. 30, 2008

(65) Prior Publication Data
US 2010/0013808 A1    Jan. 21, 2010

(30) Foreign Application Priority Data
Apr. 6, 2007   (JP) ................. 2007-100206

(51) Int. Cl.
G06F 3/038    (2006.01)
G06F 5/00     (2006.01)
G09G 3/28     (2006.01)
(52) U.S. Cl. .......................... 345/205; 345/60
(58) Field of Classification Search ............. 345/205
See application file for complete search history.

(56) References Cited

U.S. PATENT DOCUMENTS

| 5,737,272 | A | 4/1998 | Uchiyama |
| 5,986,342 | A | 11/1999 | Uchiyama et al. |
| 6,128,063 | A | 10/2000 | Uchiyama |
| 6,407,508 | B1 | 6/2002 | Kawada |
| 6,703,792 | B2 | 3/2004 | Kawada |
| RE40,706 | E * | 5/2009 | Mishima et al. ............. 349/149 |
| 2003/0076049 | A1 | 4/2003 | Kawada et al. |
| 2004/0008192 | A1* | 1/2004 | Waterman .................... 345/204 |
| 2007/0120770 | A1* | 5/2007 | Choi et al. .................... 345/60 |
| 2008/0068313 | A1* | 3/2008 | Jang ............................ 345/87 |

FOREIGN PATENT DOCUMENTS

EP    1 179 831 A2    2/2002
(Continued)

OTHER PUBLICATIONS

English Translation of Japanese patent publication JP,2000-173481,A.* International Search Report for PCT/JP2008/000870, Jul. 8, 2008.
Supplementary European Search Report for Application No. EP 08 73 8482, Dec. 28, 2010, Panasonic Corporation.
China Office Action for Application No. 200880000670.6, Aug. 5, 2010, Panasonic Corporation.

*Primary Examiner* — Joseph Haley
*Assistant Examiner* — Nicholas Lee
(74) *Attorney, Agent, or Firm* — RatnerPrestia

(57) ABSTRACT

When a connection failure occurs in an FFC for electrically interconnecting the ground potentials of the printed boards, the failure is immediately detected. A plasma display device has a scan electrode driving circuit for dividing scan electrodes into a first scan electrode group and a second scan electrode group and driving them, scan electrode driving ICs for applying a scan pulse generated by the scan electrode driving circuit to the scan electrodes, a timing generating circuit for generating switch signal SI used for switching the scan electrode driving ICs in a predetermined order, and a first printed board and second printed board that have the scan electrode driving ICs. The ground potential of the first printed board is electrically connected to that of the second printed board via an FFC. Switch signal SI is input from the first printed board to the second printed board via the FFC.

2 Claims, 6 Drawing Sheets

FOREIGN PATENT DOCUMENTS

| | | |
|---|---|---|
| JP | 2-186531 A | 7/1990 |
| JP | 2000-173481 A | 6/2000 |
| JP | 2000173481 A | 6/2000 |
| JP | 2000-250425 A | 9/2000 |
| JP | 2000250425 A | 9/2000 |
| JP | 2001-13883 A | 1/2001 |
| JP | 200113883 A | 1/2001 |
| JP | 2003-29292 A | 1/2003 |
| JP | 200329292 A | 1/2003 |
| JP | 2006-65119 A | 3/2006 |
| JP | 200665119 A | 3/2006 |

* cited by examiner

PLASMA DISPLAY DEVICE

This application is a U.S. National Phase Application of PCT International Application PCT/JP2008/000870.

TECHNICAL FIELD

The present invention relates to a plasma display device.

BACKGROUND ART

A typical alternating-current surface discharge type panel used as a plasma display panel (hereinafter referred to as "panel") has many discharge cells between a front plate and a back plate that are faced to each other.

In the front plate, a plurality of display electrode pairs each of which is formed of a scan electrode and a sustain electrode are disposed in parallel on a front glass substrate. In the back plate, a plurality of data electrodes are disposed in parallel on a back glass substrate. The front plate and back plate are faced to each other so that the display electrode pairs and the data electrodes intersect three-dimensionally, and are sealed. Discharge gas is filled into a discharge space in the sealed product. Discharge cells are disposed in intersecting parts of the display electrode pairs and the data electrodes.

A subfield method is generally used as a method of driving the panel. In this method, one field period is divided into a plurality of subfields, and the subfields at which light is emitted are combined, thereby performing gradation display. Each subfield has an initializing period, an address period, and a sustain period. In the initializing period, initializing discharge occurs, and a wall charge required for a subsequent address operation is formed on each electrode. In the address period, scan pulses are sequentially applied to scan electrodes, an address pulse is selectively applied to a data electrode of a discharge cell where display is to be performed to cause address discharge. In the sustain period, a sustain pulse is alternately applied to the display electrode pairs, sustain discharge is caused in the discharge cell where address discharge has been performed, and light is emitted, thereby displaying an image.

In such a plasma display device, the drawing section of each electrode is electrically connected to the output section of each driving circuit via a flexible flat cable (hereinafter referred to as "FFC"), and driving voltage is applied to each electrode via the FFC to drive the panel. For example, the output section of each driving circuit has a connector for being connected to the FFC. One end of the FFC whose the other end is fixed to the drawing section of the panel is connected to the connector, thereby electrically connecting each electrode to each driving circuit.

At this time, when there is an FFC that is not connected appropriately, the panel cannot be driven normally. A technology is proposed where a connection failure can be detected with color change of paint by arranging resistors electrically in series (patent document 1, for example). Here, each of the resistors is formed by coating each circuit pattern of the FFC with temperature indicating paint.

When one electric circuit is divided and mounted on a plurality of printed boards, and difference (hereinafter referred to as "potential shift") occurs between reference potentials such as ground potentials, noise can be caused by the potential shift in a signal delivered between the printed boards and malfunction can be caused. Therefore, when one electric circuit is divided and mounted on a plurality of printed boards, it is important that the reference potentials between the printed boards are previously set to be equal.

For setting the reference potentials (hereinafter, it is assumed that the ground potential is reference potential) between the printed boards to be equal, generally, the ground potentials of the printed boards are electrically interconnected using a wire. At this time, for minimizing the impedance between the ground potentials of the printed boards, generally, the impedance of the wire for interconnecting the ground potentials is reduced, and one printed board has two or more parts for interconnecting the ground potential of the one printed board to that of the other printed board.

The size of the panel has been recently increased. While, the size of a printed board having a driving circuit is restricted due to various factors. Therefore, in a plasma display device employing an enlarged panel that is difficult to be structured so that each electrode is driven only by one printed board, a plurality of printed boards must be used in order to drive each electrode.

In a plasma display device that has such an enlarged panel and has a scan electrode driving circuit dividedly mounted on a plurality of printed boards, the ground potentials of the printed boards are electrically interconnected, one printed board has a plurality of connecting parts between the ground potential of the one printed board and that of the other printed board. Thanks to this structure, the potential shift between the ground potentials of the printed boards is suppressed, and the scan electrode can be driven stably.

When an FFC is used for interconnecting the ground potentials of the printed boards, and all of a plurality of wires disposed inside the FFC are used for interconnecting the ground potentials, the impedance between the ground potentials can be suppressed to be low.

In this structure, however, the ground potentials are interconnected via a plurality of connecting parts. Therefore, even if a connection failure such as an accident that one of the FFCs used for interconnecting the ground potentials departs from the connector occurs, the ground potentials are not always put into an electrically disconnected state. The connection failure of the FFC increases the impedance between the ground potentials, so that a phenomenon that noise increases in the driving waveform applied to the scan electrode occurs, but the scan electrode driving circuit itself operates. It is difficult that a glance at a display image allows a checker to judge whether a connection failure occurs in the FFC for interconnecting the ground potentials.

[Patent document 1] Japanese Patent Unexamined Publication No. H02-186531

SUMMARY OF THE INVENTION

A plasma display device of the present invention comprises the following elements:
- a plasma display panel having a plurality of scan electrodes and a plurality of sustain electrodes;
- a scan electrode driving circuit for dividing the plurality of scan electrodes into a first scan electrode group and a second scan electrode group, and sequentially applying scan pulses to the scan electrodes belonging to the first scan electrode group and the second scan electrode group;
- a plurality of scan electrode driving integrated circuits (ICs) for applying, to each scan electrode, a scan pulse generated by the scan electrode driving circuit;
- a timing generating circuit for generating a switch signal for switching the plurality of scan electrode driving ICs in a predetermined order; and
- a first printed board and a second printed board that have the scan electrode driving ICs.

The ground potential of the first printed board is electrically connected to the ground potential of the second printed board via a flexible flat cable. A switch signal is input from the first printed board to the second printed board via the flexible flat cable.

Thus, when a connection failure occurs in the FFC for electrically connecting the ground potentials of the first printed board to that of the second printed board, the failure can be immediately detected.

Figure 1:
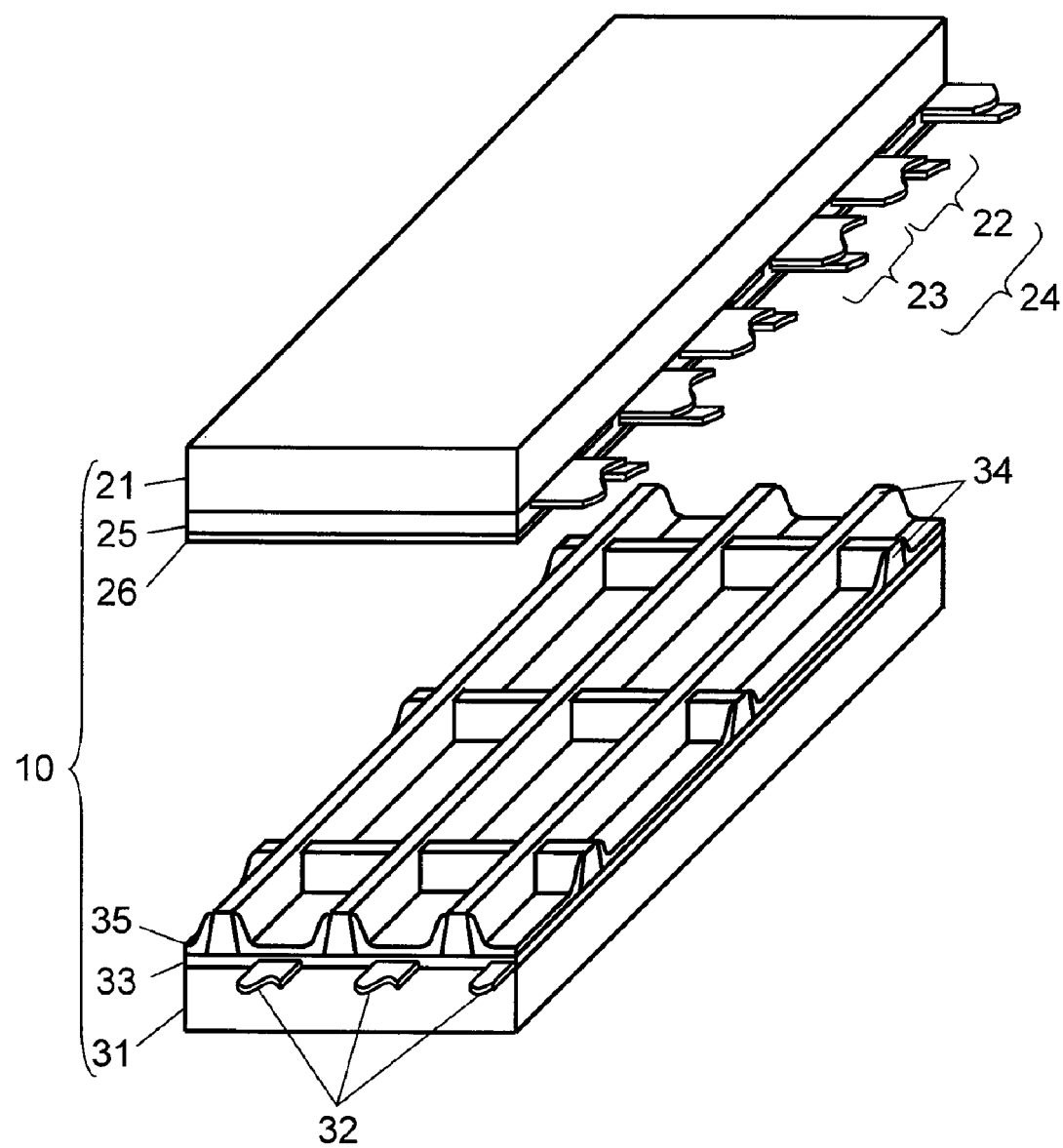
FIG. 1 is an exploded perspective view showing a structure of a panel in accordance with an exemplary embodiment of the present invention.

REFERENCE MARKS IN THE DRAWINGS 1 plasma display device
10 panel
21 front substrate
22 scan electrode
23 sustain electrode
24 display electrode pair
25, 33 dielectric layer
26 protective layer
31 back substrate
32 data electrode
34 barrier rib
35 phosphor layer
41 image signal processing circuit
42 data electrode driving circuit
43 scan electrode driving circuit
44 sustain electrode driving circuit
45 timing generating circuit
50 scan pulse generating circuit
53 odd-numbered electrode output section
54, 57 switch
56 even-numbered electrode output section
60 (1)-60 (*n*) output section
61 (1)-61 (*n*), 62 (1)-62 (*n*) switching element
70 printed board
71 first printed board
72 second printed board
73*a*, 73*b*, 75, 78 connector
74*a*, 74*b*, 76, 77 FFC
79 scan electrode driving IC

DETAILED DESCRIPTION OF PREFERRED EMBODIMENTS

A plasma display device in accordance with an exemplary embodiment of the present invention will be described hereinafter with reference to the accompanying drawings.

(Exemplary Embodiment)

FIG. 1 is an exploded perspective view showing a structure of panel 10 in accordance with the exemplary embodiment of the present invention. A plurality of display electrode pairs 24 formed of scan electrodes 22 and sustain electrodes 23 are disposed on glass-made front substrate 21. Dielectric layer 25 is formed so as to cover scan electrodes 22 and sustain electrodes 23, and protective layer 26 is formed on dielectric layer 25. A plurality of data electrodes 32 are formed on back substrate 31, dielectric layer 33 is formed so as to cover data electrodes 32, and mesh barrier ribs 34 are formed on dielectric layer 33. Phosphor layers 35 for emitting lights of respective colors of red, green, and blue are formed on the side surfaces of barrier ribs 34 and on dielectric layer 33.

Front substrate 21 and back substrate 31 are faced to each other so that display electrode pairs 24 cross data electrodes 32 with a micro discharge space sandwiched between them. The outer peripheries of front substrate 21 and back substrate 31 are sealed by a sealing material such as glass frit. The discharge space is filled with discharge gas, for example, mixed gas of neon and xenon. The discharge space is partitioned into a plurality of sections by barrier ribs 34. Discharge cells are formed in the intersecting parts of display electrode pairs 24 and data electrodes 32. The discharge cells discharge and emit light to display an image.

The structure of panel 10 is not limited to the above-mentioned one, but may be a structure having striped barrier ribs, for example.

Figure 2:
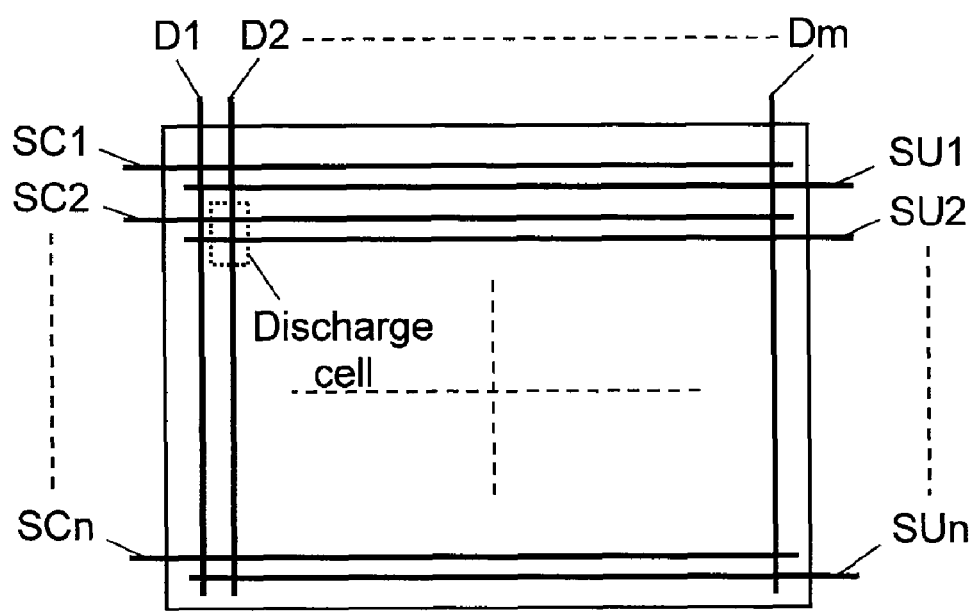
FIG. 2 is an electrode array diagram of the panel in accordance with the exemplary embodiment.

FIG. 2 is an electrode array diagram of panel 10 in accordance with the exemplary embodiment of the present invention. In panel 10, n (even number) scan electrode SC1 through scan electrode SCn (scan electrodes 22 in FIG. 1) and n sustain electrode SU1 through sustain electrode SUn (sustain electrodes 23 in FIG. 1) long in the column direction are arranged, and m data electrode D1 through data electrode Dm (data electrodes 32 in FIG. 1) long in the row direction are arranged. Each discharge cell is formed in the intersecting part of a pair of scan electrode SCi (i is 1 through n) and sustain electrode SUi and one data electrode Dj (j is 1 through m). In other words, the number of discharge cells formed in the discharge space is m×n.

In the present embodiment, it is assumed that "n" is an even number, odd-numbered scan electrode SC1, scan electrode SC3, . . . , and scan electrode SCn−1 belong to a first scan electrode group, and even-numbered scan electrode SC2, scan electrode SC4, . . . , and scan electrode SCn belong to a second scan electrode group.

Figure 3:
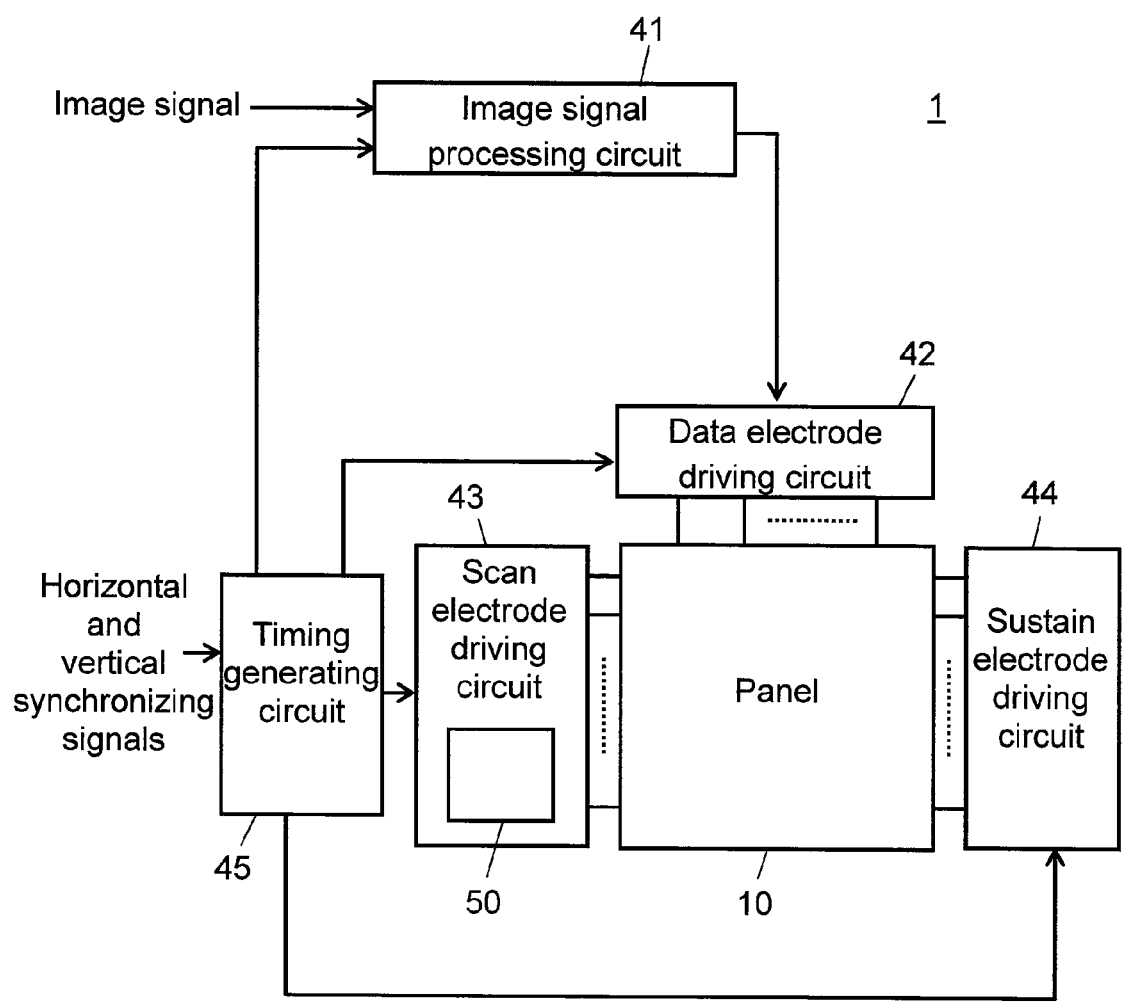
FIG. 3 is a circuit block diagram of a plasma display device in accordance with the exemplary embodiment.

FIG. 3 is a circuit block diagram of plasma display device 1 in accordance with the exemplary embodiment of the present invention. Plasma display device 1 has the following elements:

panel 10;
  image signal processing circuit 41;
  data electrode driving circuit 42;
  scan electrode driving circuit 43;
  sustain electrode driving circuit 44;
  timing generating circuit 45; and
  a power supply section (not shown) for supplying power required for each circuit block.

Image signal processing circuit 41 converts an input image signal into image data that indicates emission or non-emission of light in each subfield. Data electrode driving circuit 42 converts the image data of each subfield into a signal corresponding to each of data electrode D1 through data electrode Dm, and drives each of data electrodes D1 through data electrode Dm.

Timing generating circuit 45 generates various timing signals for controlling the operation of each circuit block based on a horizontal synchronizing signal and a vertical synchronizing signal, and supplies them to respective circuit blocks. These timing signals include a control signal of each IC such as a scan electrode driving IC and a switch signal of a switch disposed in each circuit block. Sustain electrode driving circuit 44 drives sustain electrode SU1 through sustain electrode SUn based on a timing signal.

Scan electrode driving circuit 43 has a scan pulse generating circuit 50 for generating various voltages and scan pulses to be applied to scan electrode SC1 through scan electrode SCn in the address period, and drives each of scan electrode SC1 through scan electrode SCn based on the timing signal. Each driving voltage is applied to scan electrode SC1 through scan electrode SCn via the scan electrode driving IC (described in FIG. 6 later) having a plurality of switching elements, and the switch signal for switching the scan electrode driving IC is also generated by timing generating circuit 45.

Next, a driving voltage waveform for driving panel 10 and its operation are described. Plasma display device 1 performs gradation display by a subfield method. In this method, one field period is divided into a plurality of subfields, and emission and non-emission of light of each discharge cell are controlled in each subfield. Each subfield has an initializing period, an address period, and a sustain period.

In the initializing period, initializing discharge is performed to form, on each electrode, a wall charge required for a subsequent address discharge. In the address period, address discharge is selectively caused in a discharge cell to emit light, thereby forming a wall charge. In the sustain period, sustain discharge is caused in the discharge cell having caused address discharge, thereby emitting light.

In the exemplary embodiment, the address period is divided into a first address period, in which scan pulses are sequentially applied to scan electrodes belonging to the first scan electrode group, and a second address period, in which scan pulses are sequentially applied to scan electrodes belonging to the second scan electrode group. The scan electrodes belonging to the first scan electrode group are odd-numbered scan electrode SC1, scan electrode SC3, . . . , and scan electrode SCn−1, and the scan electrodes belonging to the second scan electrode group are even-numbered scan electrode SC2, scan electrode SC4, . . . , and scan electrode SCn. Hereinafter, the first address period is referred to as "odd period", and the second address period is referred to as "even period".

Figure 4:
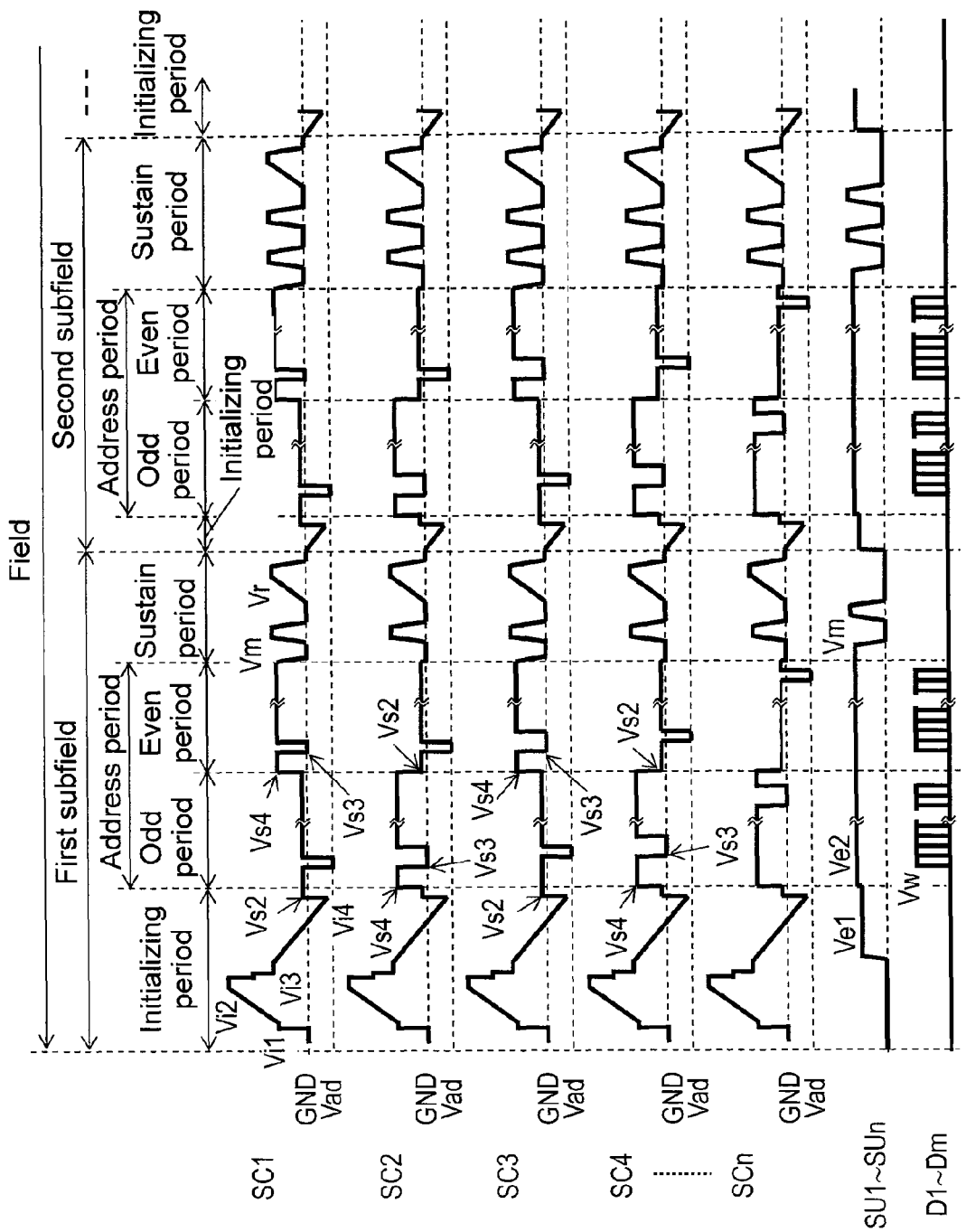
FIG. 4 is a waveform chart of driving voltage applied to each electrode of the panel in accordance with the exemplary embodiment.

Next, a driving voltage waveform for driving panel 10 and its operation are described. FIG. 4 is a waveform chart of driving voltage applied to each electrode of panel 10 in accordance with the exemplary embodiment of the present invention. In the exemplary embodiment, one field period is constituted by 10 subfields, and FIG. 4 shows the driving voltage waveforms of two subfields. In the following description, scan electrode SCi, sustain electrodes SUi, and data electrode Dk are selected from all electrodes based on the image data.

In the first half of the initializing period of the first subfield, voltage 0 (V) is applied to data electrode D1 through data electrode Dm and sustain electrode SU1 through sustain electrode SUn. A ramp waveform voltage is applied to scan electrode SC1 through scan electrode SCn. Here, the ramp waveform voltage gradually increases from voltage Vi1, which is not higher than a discharge start voltage, to voltage Vi2, which is higher than the discharge start voltage, with respect to sustain electrode SU1 through sustain electrode SUn. While this ramp waveform voltage increases, feeble initializing discharge occurs between scan electrode SC1 through scan electrode SCn and sustain electrode SU1 through sustain electrode SUn, and feeble initializing discharge occurs between scan electrode SC1 through scan electrode SCn and data electrode D1 through data electrode Dm. Negative wall voltage is accumulated on scan electrode SC1 through scan electrode SCn, and positive wall voltage is accumulated on data electrode D1 through data electrode Dm and sustain electrode SU1 through sustain electrode SUn. Here, the wall voltage on the electrodes means the voltage generated by the wall charges accumulated on the dielectric layer covering the electrodes, the protective layer, and the phosphor layer.

In the last half of the initializing period, positive voltage Ve1 is applied to sustain electrode SU1 through sustain electrode SUn. A ramp waveform voltage is applied to scan electrode SC1 through scan electrode SCn. Here, the ramp waveform voltage gradually decreases from voltage Vi3, which is not higher than the discharge start voltage, to voltage Vi4, which is higher than the discharge start voltage, with respect to sustain electrode SU1 through sustain electrode SUn. While the ramp waveform voltage decreases, feeble initializing discharge occurs between scan electrode SC1 through scan electrode SCn and sustain electrode SU1 through sustain electrode SUn, and feeble initializing discharge occurs between scan electrode SC1 through scan electrode SCn and data electrode D1 through data electrode Dm. Then, the negative wall voltage on scan electrode SC1 through scan electrode SCn and the positive wall voltage on sustain electrode SU1 through sustain electrode SUn are reduced, positive wall voltage on data electrode D1 through data electrode Dm is adjusted to a value suitable for the address operation.

The first half of the initializing period may be omitted in some subfield of the subfields constituting one field. In this case, an initializing operation is selectively performed in the discharge cell where the sustain discharge has been performed in a subfield immediately before the subfield. FIG. 4 shows a driving voltage waveform where an initializing operation having the first half and the last half is performed in the initializing period of the first subfield and an initializing operation having only the last half is performed in the initializing period of the second subfield or later.

In an odd period of the subsequent address period, voltage Ve2 is applied to sustain electrode SU1 through sustain electrode SUn, second voltage Vs2 is applied to each of odd-numbered scan electrode SC1, scan electrode SC3, . . . , and scan electrode SCn−1, and fourth voltage Vs4 is applied to each of even-numbered scan electrode SC2, scan electrode SC4, . . . , and scan electrode SCn. Here, fourth voltage Vs4 is higher than second voltage Vs2.

Next, negative scan pulse voltage Vad is applied to scan electrode SC1 existing at the first position from the upside. Positive address pulse voltage Vw is applied to data electrode Dk (k is 1 through m), of data electrode D1 through data electrode Dm, in the discharge cell to emit light first. At this time, in the present embodiment, third voltage Vs3 lower than fourth voltage Vs4 is applied to a scan electrode adjacent to scan electrode SC1, namely scan electrode SC2 existing at the second position from the upside. This prevents excessive voltage difference from being applied between adjacent scan electrode SC1 and scan electrode SC2.

The voltage difference in the intersecting part of scan electrode SC1 and data electrode Dk of the discharge cell to which address pulse voltage Vw is applied is obtained by adding the difference between the wall voltage on data electrode Dk and that on scan electrode SC1 to the difference (Vw−Vad) of the external applied voltage. The obtained voltage difference exceeds the discharge start voltage. Address discharge occurs between data electrode Dk and scan electrode SC1 and between sustain electrode SU1 and scan electrode SC1. Positive wall voltage is accumulated on scan electrode SC1, negative wall voltage is accumulated on sustain electrode SU1, and negative wall voltage is also accumulated on data electrode Dk. Thus, an address operation is performed that causes address discharge in the discharge cell to emit light first and accumulates wall voltage on each electrode. The voltage in the intersecting parts of scan electrode SC1 and data electrode D1 through data electrode Dm to which address pulse voltage Vw is not applied does not exceed the discharge start voltage, so that address discharge does not occur.

Then, scan pulse voltage Vad is applied to scan electrode SC3 at the third position from the upside, and positive address pulse voltage Vw is applied to data electrode Dk, of data electrode D1 through data electrode Dm, in the discharge cell to emit light third. At this time, third voltage Vs3 is applied to the scan electrodes adjacent to scan electrode SC3, namely scan electrode SC2 and scan electrode SC4 existing at the second and fourth positions from the upside. Then, the address operation is performed where address discharge occurs between data electrode Dk and scan electrode SC3 of this discharge cell, and address discharge occurs between sustain electrode SU3 and scan electrode SC3, and wall voltage is accumulated on each electrode.

Regarding odd-numbered scan electrode SC5, scan electrode SC7, . . . , and scan electrode SCn−1, an address operation is performed similarly. Third voltage Vs3 is also applied to even-numbered scan electrode SCp (p is even number, 1≦p≦n) and scan electrode SCp+2 that are adjacent to the odd-numbered scan electrode SCp+1 where the address operation is performed at this time.

In a subsequent even period, second voltage Vs2 is applied to even-numbered scan electrode SC2, scan electrode SC4, . . . , and scan electrode SCn, and fourth voltage Vs4 is applied to odd-numbered scan electrode SC1, scan electrode SC3, . . . , and scan electrode SCn−1.

Next, negative scan pulse voltage Vad is applied to scan electrode SC2 existing at the second position from the upside, and positive address pulse voltage Vw is applied to data electrode Dk, of data electrode D1 through data electrode Dm, in the discharge cell to emit light second. At this time, third voltage Vs3 lower than fourth voltage Vs4 is applied to the scan electrodes adjacent to scan electrode SC2, namely scan electrode SC1 and scan electrode SC3 existing at the first and third positions from the upside.

The voltage difference in the intersecting part of data electrode Dk of the discharge cell and scan electrode SC2 exceeds the discharge start voltage, and causes address discharge in the discharge cell to emit light at the second position from the upside, thereby performing an address operation of accumulating wall voltage on each electrode.

Then, scan pulse voltage Vad is applied to scan electrode SC4 existing at the fourth position from the upside, and positive address pulse voltage Vw is applied to data electrode Dk in the discharge cell to emit light fourth. At this time, third voltage Vs3 is applied to the scan electrodes adjacent to scan electrode SC4, namely scan electrode SC3 and scan electrode SC5 existing at the third and fifth positions from the upside. Then, the address discharge occurs in the discharge cell.

Regarding even-numbered scan electrode SC6, scan electrode SC8, . . . , and scan electrode SCn, an address operation is performed similarly. Third voltage Vs3 is also applied to odd-numbered scan electrode SCp−1 and scan electrode SCp+1 that are adjacent to the even-numbered scan electrode SCp where the address operation is performed at this time.

In the subsequent sustain period, positive sustain pulse voltage Vm is firstly applied to scan electrode SC1 through scan electrode SCn, and voltage 0 (V) is applied to sustain electrode SU1 through sustain electrode SUn. In the discharge cell having caused the address discharge, the voltage difference between scan electrode SCi and sustain electrode SUi is obtained by adding the difference between the wall voltage on scan electrode SCi and that on sustain electrode SUi to sustain pulse voltage Vm. The obtained voltage difference exceeds the discharge start voltage. Sustain discharge occurs between scan electrode SCi and sustain electrode SUi, and ultraviolet rays generated at this time cause phosphor layer 35 to emit light. Negative wall voltage is accumulated on scan electrode SCi, and positive wall voltage is accumulated on sustain electrode SUi. Positive wall voltage is also accumulated on data electrode Dk. In the discharge cell where address discharge does not occur in the address period, sustain discharge does not occur, and the wall voltage at the completion of the initializing period is kept.

Subsequently, voltage 0 (V) is applied to scan electrode SC1 through scan electrode SCn, and sustain pulse voltage Vm is applied to sustain electrode SU1 through sustain electrode SUn. In the discharge cell having caused the sustain discharge, the voltage difference between sustain electrode SUi and scan electrode SCi exceeds the discharge start voltage. Therefore, sustain discharge occurs between sustain electrode SUi and scan electrode SCi again. Negative wall voltage is accumulated on sustain electrode SUi, and positive wall voltage is accumulated on scan electrode SCi. Hereinafter, similarly, as many sustain pulses as the number corresponding to the luminance weight are alternately applied to scan electrode SC1 through scan electrode SCn and sustain electrode SU1 through sustain electrode SUn, and potential difference is caused between the electrodes of the display electrode pairs. Thus, sustain discharge occurs continuously in the discharge cell that has caused the address discharge in the address period.

At the end of the sustain period, a ramp waveform voltage that gradually increases to voltage Vr is applied to scan electrode SC1 through scan electrode SCn. While the positive wall voltage is kept on data electrode Dk, wall voltages on scan electrode SCi and sustain electrode SUi are eliminated. Thus, the sustain operation in the sustain period is completed.

Next, a detailed configuration of scan pulse generating circuit 50 is described. In the present embodiment, it is assumed that the difference between second voltage Vs2 and scan pulse voltage Vad is equal to the difference between fourth voltage Vs4 and third voltage Vs3. This voltage difference is hereinafter referred to as voltage Vscn. In other words, (Vs2−Vad)=(Vs4−Vs3)=Vscn.

Figure 5:
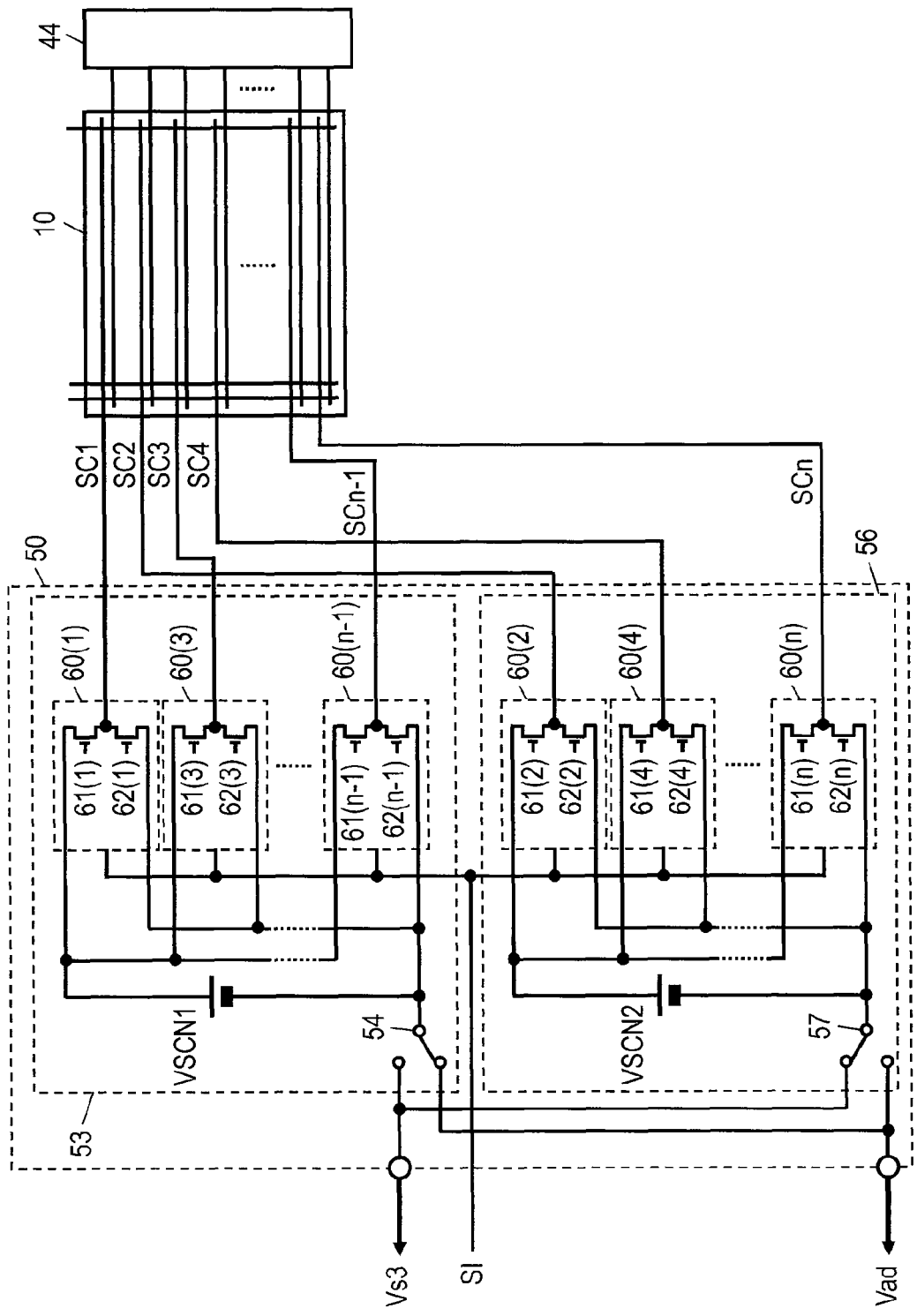
FIG. 5 is a circuit diagram showing the configuration of a scan pulse generating circuit of the plasma display device in accordance with the exemplary embodiment.

FIG. 5 is a circuit diagram showing the configuration of scan pulse generating circuit 50 of plasma display device 1 in accordance with the exemplary embodiment of the present invention. FIG. 5 also shows panel 10 and sustain electrode driving circuit 44. Scan pulse generating circuit 50 has the following elements:

odd-numbered electrode output section 53 for outputting driving voltage to be applied to odd-numbered scan electrode SC1, scan electrode SC3, . . . , and scan electrode SCn−1; and even-numbered electrode output section 56 for outputting driving voltage to be applied to even-numbered scan electrode SC2, scan electrode SC4, . . . , and scan electrode SCn.

A circuit for generating driving voltage waveforms in the initializing period and sustain period is omitted. As described later, in the wiring on the printed boards, switch signal SI generated by timing generating circuit 45 is input to the printed board disposed upside, of two printed boards mounted with a scan electrode driving IC, and is input from this printed board to the printed board disposed downside. FIG. 5 shows a simplified diagram where switch signal SI is input to odd-numbered electrode output section 53 and even-numbered electrode output section 56.

Odd-numbered electrode output section 53 has the following elements:
floating power supply VSCN1 of voltage Vscn;
switch 54 for connecting the lower voltage side of floating power supply VSCN1 to scan pulse voltage Vad or third voltage Vs3; and
output section 60 (1), output section 60 (3), . . . , and output section 60 (n−1) for applying the voltage on the lower voltage side of floating power supply VSCN1 or the voltage on the higher voltage side to odd-numbered scan electrode SC1, scan electrode SC3, . . . , and scan electrode SCn−1, respectively. Output section 60 (1) has the following elements:
switching element 61 (1) for outputting the voltage on the higher voltage side of floating power supply VSCN1; and
switching element 62 (1) for outputting the voltage on the lower voltage side of floating power supply VSCN1.

Output section 60 (3) similarly has switching element 61 (3) and switching element 62 (3). Output section 60 (5), output section 60 (7), . . . , and output section 60 (n−1) are configured in the same manner.

Even-numbered electrode output section 56 has the following elements:
floating power supply VSCN2 of voltage Vscn;
switch 57 for connecting the lower voltage side of floating power supply VSCN2 to scan pulse voltage Vad or third voltage Vs3; and
output section 60 (2), output section 60 (4), . . . , and output section 60 (n) for applying the voltage on the lower voltage side of floating power supply VSCN2 or the voltage on the higher voltage side to even-numbered scan electrode SC2, scan electrode SC4, . . . , and scan electrode SCn, respectively. Output section 60 (2) has the following elements:
switching element 61 (2) for outputting the voltage on the higher voltage side of floating power supply VSCN2; and
switching element 62 (2) for outputting the voltage on the lower voltage side of floating power supply VSCN2.

Output section 60 (4), output section 60 (6), . . . , and output section 60 (n) are configured in the same manner.

Switch signals SI that are generated by timing generating circuit 45 and are used for switching and operating output section 60 (1) through output section 60 (n) in a predetermined order are input to output section 60 (1) through output section 60 (n), respectively. Thus, each scan pulse can be generated with the timing shown in the address period of the driving voltage waveform of FIG. 4.

In this case, scan pulse generating circuit 50 is configured using the scan electrode driving IC (not shown) where a plurality of output sections 60 are integrated into a package. Specifically, scan pulse generating circuit 50 is configured using a plurality of scan electrode driving ICs including 90 output sections 60. Each scan electrode driving IC includes 90 sequential output sections, of output section 60 (1) through output section 60 (n). In other words, first scan electrode driving IC includes output section 60 (1) through output section 60 (90), next scan electrode driving IC includes output section 60 (91) through output section 60 (180), and so on.

Each above-mentioned numerical value is just one example, and is required to be optimally set based on the used driving IC or the specification of the panel.

Power supply VSCN1 and power supply VSCN2 may be configured using a DC-DC converter or the like, for example. However, they can be easily configured using a bootstrap circuit having a diode and a capacitor.

Next, the layout and wiring of the printed boards in the present embodiment are described.

Figure 6:
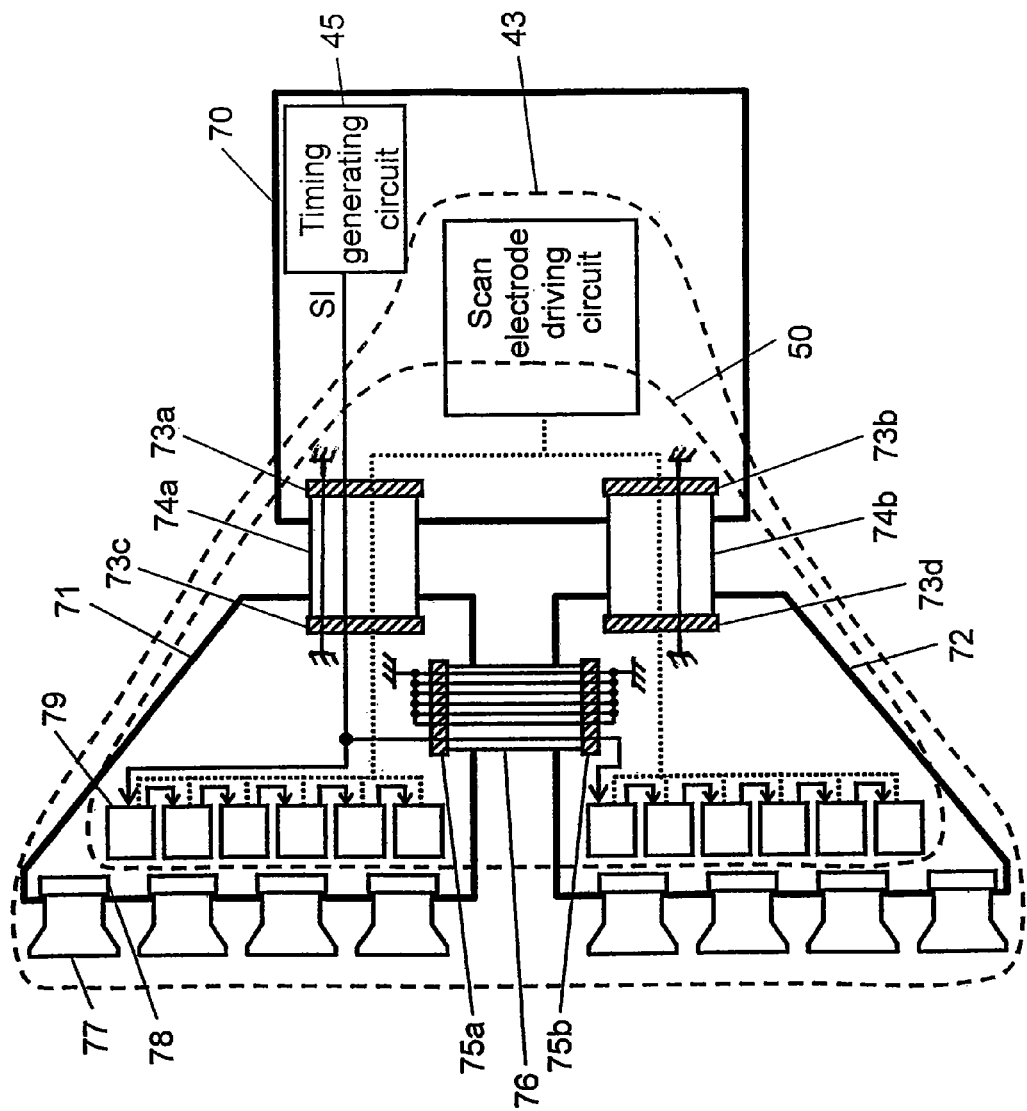
FIG. 6 is a schematic diagram showing an example of the layout of a printed board used for driving a scan electrode in accordance with the exemplary embodiment.

FIG. 6 is a schematic diagram showing an example of the layout of the printed boards used for driving scan electrode SC1 through scan electrode SCn in accordance with the exemplary embodiment. FIG. 6 shows the layout of the printed boards and the connection between the printed boards.

In the present embodiment, as shown in FIG. 6, scan electrode SC1 through scan electrode SCn are driven using three following printed boards:
printed board 70 mounted with part of scan electrode driving circuit 43;
first printed board 71 mounted with half (here, six) of a plurality of scan electrode driving ICs 79 included in scan electrode driving circuit 43; and
second printed board 72 mounted with remaining (here, six) scan electrode driving ICs 79.

Printed board 70 can be electrically connected to first printed board 71 by connecting connector 73a mounted on printed board 70 to connector 73c mounted on first printed board 71 via FFC 74a. Printed board 70 can be electrically connected to second printed board 72 by connecting connector 73b mounted on printed board 70 to connector 73d mounted on second printed board 72 via FFC 74b.

Thus, as shown by dotted lines in FIG. 6, the driving voltage output from scan electrode driving circuit 43 is input to first printed board 71 via connector 73a, FFC 74a, and connector 73c, is input to second printed board 72 via connector 73b, FFC 74b, and connector 73d, and then is input to each scan electrode driving IC 79.

Each scan electrode driving IC 79 is electrically connected to each of scan electrode SC1 through scan electrode SCn by connecting each of connectors 78 mounted on first printed board 71 and second printed board 72 to each of FFCs 77. The electrode terminal disposed at one end of each FFC 77 is electrically connected to an interconnect electrode of each of scan electrode SC1 through scan electrode SCn. Thus, the driving voltage output from scan electrode driving ICs 79 can be applied to scan electrode SC1 through scan electrode SCn via connectors 78 and FFCs 77.

The ground potential of first printed board 71 can be electrically connected to the ground potential of second printed board 72 by connecting connector 75a mounted on first printed board 71 to connector 75b mounted on second printed board 72 via FFC 76

As discussed above, in the present embodiment, scan electrode SC1 through scan electrode SCn are divided into two electrode groups, namely the first scan electrode group and second scan electrode group, and are driven. Therefore, when potential shift occurs between the ground potential on the first printed board and that on the second printed board, noise can be caused by the potential shift in the driving voltage waveform to be applied to scan electrode SC1 through scan electrode SCn. In order to prevent noise from being caused by the potential shift, the ground potential on first printed board 71 and that on second printed board 72 are required to be equal as much as possible.

In the present embodiment, the ground potential on printed board 70 is connected to the ground potential on first printed board 71 using part of the wires included in FFC 74a (not shown), the ground potential on printed board 70 is connected to the ground potential on second printed board 72 using part of the wires included in FFC 74b (not shown), and thus the ground potential on printed board 70, the ground potential on first printed board 71, and the ground potential on second printed board 72 are electrically interconnected. If the impedance between the ground potentials on the respective printed boards is high, potential difference can occur between the ground potentials even when the ground potentials are electrically interconnected in the circuit. In the present embodiment, for reducing the impedance between the ground potentials, the ground potential on first printed board 71 is electrically connected to the ground potential on second printed board 72 via FFC 76.

Each FFC is formed of a printed wiring board having flexibility so that it can be routed flexibly, and has a plurality of stripe-like wires formed by printing a metal foil on a generally known flexible resin substrate such as polyimide. An insulating section is disposed between the wires so that the wires are electrically insulated from each other. In FFC 76, all wires except one wire used for transmitting switch signal SI are used for the connection between the ground potentials. Thus, using almost all wires of FFC 76 for the connection between the ground potentials further reduces the impedance between the ground potential on first printed board 71 and that on second printed board 72. In the present embodiment, the potential shift between the ground potentials of printed boards mounted with scan electrode driving circuit 43 is suppressed, and the noise generated by the potential shift is reduced.

The reason why one of the plurality of wires included in FFC 76 is used for transmitting switch signal SI is described hereinafter.

Switch signal SI generated by timing generating circuit 45 is a control signal used for switching output section 60 (1) through output section 60 (n) in scan electrode driving ICs 79 in a predetermined order and for generating each scan pulse with the timing shown in the address period of the driving voltage waveform of FIG. 4. Switch signal SI must be input to each of scan electrode driving ICs 79 mounted on first printed board 71 and scan electrode driving ICs 79 mounted on second printed board 72.

In the present embodiment, switch signal SI coming from timing generating circuit 45 is input to first scan electrode driving IC 79, then switch signal SI coming from this scan electrode driving IC 79 is input to subsequent scan electrode driving IC 79, and switch signal SI is sequentially delivered from scan electrode driving IC 79 to subsequent scan electrode driving IC 79. The same is true of scan electrode driving ICs 79 mounted on first printed board 71 and scan electrode driving ICs 79 mounted on second printed board 72.

For operating scan electrode driving ICs 79 in the correct order, it is simply required to input switch signal SI from printed board 70 to first printed board 71 via FFC 74a, and to input switch signal SI from printed board 70 to second printed board 72 via FFC 74b. In the present embodiment, however, switch signal SI to be input to second printed board 72 is not directly input from printed board 70 to second printed board 72, but switch signal SI is temporarily input from printed board 70 to first printed board 71 via FFC 74a and is input to second printed board 72 via FFC 76.

FFC 76 electrically connects the ground potential on first printed board 71 to the ground potential on second printed board 72. Simultaneously, FFC 74a connects the ground potential on printed board 70 to the ground potential on first printed board 71, and FFC 74b connects the ground potential on printed board 70 to the ground potential on second printed board 72. Therefore, even if FFC 76 departs from connector 75a or connector 75b, the ground potential on first printed board 71 is kept to be electrically connected to the ground potential on second printed board 72 via the ground potential on printed board 70.

In the conventional configuration, switch signal SI is input from printed board 70 to each of first printed board 71 and second printed board 72 and all of the wires of FFC 76 are used for connecting between the ground potentials, when a connection failure that FFC 76 departs from connector 75a or connector 75b occurs, it is difficult to immediately detect the failure.

In the present embodiment, however, switch signal SI is input from printed board 70 to first printed board 71, and is input from first printed board 71 to second printed board 72 via FFC 76, as discussed above. Therefore, when FFC 76 departs from connector 75a or connector 75b, switch signal SI is not input to second printed board 72, scan electrode driving ICs 79 are not switched correctly, and hence an image cannot be displayed normally. Therefore, the connection failure of FFC 76 can be detected.

As discussed above, in plasma display device 1 of the present embodiment, scan electrode SC1 through scan electrode SCn are divided into a first scan electrode group and a second scan electrode group, and are driven. At this time, one field period is formed of a plurality of subfields having a first address period, in which scan pulses are sequentially applied to scan electrodes belonging to the first scan electrode group, and a second address period, in which scan pulses are sequentially applied to scan electrodes belonging to the second scan electrode group. Switch signal SI for switching scan electrode driving ICs 79 in the predetermined order is temporarily input from timing generating circuit 45 to first printed board 71, and is input to second printed board 72 via FFC 76. Here, FFC 76 electrically connects the ground potential on first printed board 71 to the ground potential on second printed board 72. Therefore, when a connection failure occurs in FFC 76, the failure can be detected.

In the present embodiment, the configuration has been described where scan electrode driving ICs 79 are divided and mounted on two printed boards, namely first printed board 71 and second printed board 72. However, even when scan electrode driving ICs 79 are divided and mounted on three printed boards or more, employing a similar configuration can provide a similar advantage.

In the present embodiment, switch signal SI is input to second printed board 72 via first printed board 71. However, switch signal SI may be input to first printed board 71 via second printed board 72.

In the present embodiment, half of scan electrode driving ICs 79 are mounted on first printed board 71, and remaining half of scan electrode driving ICs 79 are mounted on second printed board 72. However, strict half is not required, namely the number of scan electrode driving ICs 79 on first printed board 71 may differ from that on second printed board 72.

In the present embodiment, it has been assumed that the odd-numbered scan electrodes belong to the first scan electrode group, and the even-numbered scan electrodes belong to the second scan electrode group. However, it may be assumed that the odd-numbered scan electrodes belong to the second scan electrode group, and the even-numbered scan electrodes belong to the first scan electrode group. For example, the first scan electrode group and the second scan electrode group may be switched field by field.

In the present invention, the number of subfields, the luminance weight of each subfield, and the period of pulse width T are not limited to specific values. Various specific numerical values used in the present embodiment are just one example. Preferably, they are appropriately set at the optimal values in response to the characteristic of the panel, the specification of the plasma display device, and the like.

Industrial Applicability

In the plasma display device of the present invention configured so as to drive a scan electrode using a plurality of printed boards, when a connection failure occurs in an FFC for electrically connecting between the ground potentials on printed boards, the failure can be immediately detected. Therefore, the present invention is useful for improving the reliability of the plasma display device.

The invention claimed is:

1. A plasma display device comprising:
   a plasma display panel having a plurality of scan electrodes and a plurality of sustain electrodes;
   a main circuit board having mounted thereon:
      a scan electrode driving circuit for dividing the plurality of scan electrodes into a first scan electrode group and a second scan electrode group, and sequentially applying scan pulses to the scan electrodes belonging to the first scan electrode group and the second scan electrode group;
      a timing generating circuit for generating a switch signal;
   a first circuit board having mounted thereon:
      a first plurality of scan electrode driving ICs for applying scan pulses to the scan electrodes in the first scan electrode group; and
   a second circuit board having mounted thereon:
      a second plurality of scan electrode driving ICs for applying scan pulses to the scan electrodes in the second scan electrode group;
   a first flexible flat cable electrically connecting the main circuit board to the first circuit board,
   a second flexible flat cable electrically connecting the main circuit board to the second circuit board, and
   a third flexible flat cable electrically connecting the first circuit board to the second circuit board,
   wherein:
      a) the switch signal is input from the timing generating circuit on the main circuit board to a first scan electrode driving IC of the first plurality of scan electrode driving ICs on the first circuit board through the first flexible flat cable,
      b) the switch signal is input from the timing generating circuit on the main circuit board to a first scan electrode driving IC of the second plurality of scan electrode driving ICs on the second circuit board through the first flexible flat cable, the first circuit board and the third flexible flat cable, and
      c) a ground potential of the first circuit board is connected to a ground potential of the second circuit board through the third flexible flat cable,
      d) a ground potential of the main circuit board is connected to the ground potential of the first circuit board through the first flexible flat cable, and
      e) the ground potential of the main circuit board is connected to the ground potential of the second circuit board through the second flexible flat cable.

2. The plasma display device of claim 1, wherein the plasma display device:
   a) detects a failure of the first flexible flat cable if both the first plurality of scan electrode driving ICs and the second plurality of scan electrode driving ICs do not receive the switch signal, and
   b) detects a failure of the third flexible flat cable if the first plurality of scan electrode driving ICs receives the switch signal and the second plurality of scan electrode driving ICs do not receive the switch signal.

* * * * *